(12) United States Patent
Sugumar et al.

(10) Patent No.: US 10,901,018 B2
(45) Date of Patent: Jan. 26, 2021

(54) SYSTEM AND METHOD FOR DROOP DETECTION

(71) Applicant: Cavium, LLC, Santa Clara, CA (US)

(72) Inventors: Rabin Sugumar, Santa Clara, CA (US); Bharath Upputuri, Santa Clara, CA (US); Bruce Kauffman, Santa Clara, CA (US); Novinder Waraich, Santa Clara, CA (US); Bivraj Koradia, Santa Clara, CA (US); Paul Sebata, Santa Clara, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 129 days.

(21) Appl. No.: 16/224,601

(22) Filed: Dec. 18, 2018

(65) Prior Publication Data

US 2020/0191843 A1 Jun. 18, 2020

(51) Int. Cl.
*G01R 25/00* (2006.01)
*G01R 31/30* (2006.01)
*G06F 1/28* (2006.01)

(52) U.S. Cl.
CPC ....... *G01R 25/005* (2013.01); *G01R 31/3004* (2013.01); *G06F 1/28* (2013.01)

(58) Field of Classification Search
CPC ...... G01R 25/00; G01R 25/005; G01R 31/30; G01R 31/3004; G06F 1/28
See application file for complete search history.

(56) References Cited

U.S. PATENT DOCUMENTS

| | | | |
|---|---|---|---|
| 6,288,574 B1 * | 9/2001 | Neary | G01R 25/00 327/12 |
| 10,348,281 B1 | 7/2019 | Oliver et al. | |
| 10,469,091 B2 | 11/2019 | Roham | |
| 2003/0011416 A1 * | 1/2003 | Miura | H03H 11/26 327/276 |
| 2004/0119521 A1 * | 6/2004 | Kurd | H03L 7/091 327/291 |
| 2012/0187991 A1 | 7/2012 | Sathe et al. | |
| 2012/0242490 A1 * | 9/2012 | Ramaswami | G06F 1/28 340/663 |
| 2016/0034014 A1 * | 2/2016 | Turullols | G01R 31/3004 713/320 |
| 2018/0091125 A1 * | 3/2018 | Carlson | G06F 1/324 |

* cited by examiner

*Primary Examiner* — Son T Le

(57) ABSTRACT

A system includes a plurality of delay elements configured to receive an input clock signal. The system further includes an edge transition detector coupled to the plurality of delay elements. The plurality of delay elements is configured to detect the input clock signal transitioning from one value to another value. The system also includes a circuitry configured to determine a number of delay elements of the plurality of delay elements that the input clock signal propagates through prior to the input clock signal transitioning. The system also includes a logic or controller configured to determine whether a droop event has occurred based on the number of delay elements.

20 Claims, 11 Drawing Sheets

Figure 2B

SYSTEM AND METHOD FOR DROOP DETECTION

BACKGROUND

During chip operation, power drawn may vary with chip activity. For a non-limiting example, during high chip activity more power may be supplied and during low chip activity less power may be supplied, causing current and/or voltage to change accordingly. During operation, chip activity may increase very quickly, resulting in an increase in the current. Presence of inductance in the chip, however, may prevent the current from rising as quickly as desired. As a result, the voltage may drop below operational levels if the current does not keep up with activity (also referred to as droop), which may lead to functional failures of the chip. For stable chip operation, it is desirable to be able to maintain the voltage steady while being able to vary the power as needed.

In some conventional systems, the base voltage is increased so that, even in presence of voltage droop, the chip would not experience a functional failure. However, increasing the base voltage increases the power requirement.

The foregoing examples of the related art and limitations related therewith are intended to be illustrative and not exclusive. Other limitations of the related art will become apparent upon a reading of the specification and a study of the drawings.

SUMMARY

Accordingly, the embodiments described herein detects a droop event (e.g., voltage droop) due to sudden rise in chip activity. Furthermore, the embodiments compensate for the sudden rise in activity by forming a modified clocking signal to compensate for the droop event. For a non-limiting example, in some embodiments, the modified clocking signal reduces the frequency of the clocking signal when a droop event is detected to maintain the chip operational and functional. It is appreciated that the embodiments modify the clocking signal intelligently without a significant drop in performance, which may be experienced if the frequency of the clocking signal is halved. Furthermore, the embodiments compensate for the droop event without reconfiguring the phase locked loop (PLL) to output a lower frequency because PLL's response time is typically in the microseconds range and therefore cannot respond fast enough when a droop event occurs. The embodiments quickly reduce the frequency by a flexible amount depending on the circumstances, therefore compensating for the droop events.

In some embodiments, a system includes a plurality of delay elements, an edge transition detector, a circuitry, and a processor. The plurality of delay elements is configured to receive an input clock signal. The edge transition detector is coupled to the plurality of delay elements. The plurality of delay elements is configured to detect the input clock signal transitioning from one value to another value. The circuitry is configured to determine a number of delay elements of the plurality of delay elements that the input clock signal travels through prior to the input clock signal transitioning. The processor is configured to determine whether a droop event has occurred based on the number of delay elements.

In some embodiments, the droop event is compensated for when a droop event is detected. The system includes a controller configured to receive a signal indicating whether a droop event has occurred. The system further includes a plurality of delay elements. Each delay element of the plurality of delay elements responsive to a signal from the controller receives an input signal and outputs an output signal that is a delayed version of the input signal. At least one delay element of the plurality of delay elements receives a clocking signal as its input signal. The system also includes selector configured to select rising edges and falling edges of output signals from the plurality of delay elements to form a modified clocking signal. The modified clocking signal is a modified version of the clocking signal.

These and other features and advantages will be apparent from a reading of the following detailed description.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B show an example of a droop event detection system and an exemplary clocking signal associated therewith in accordance with some embodiments.

DETAILED DESCRIPTION

Figure 1:
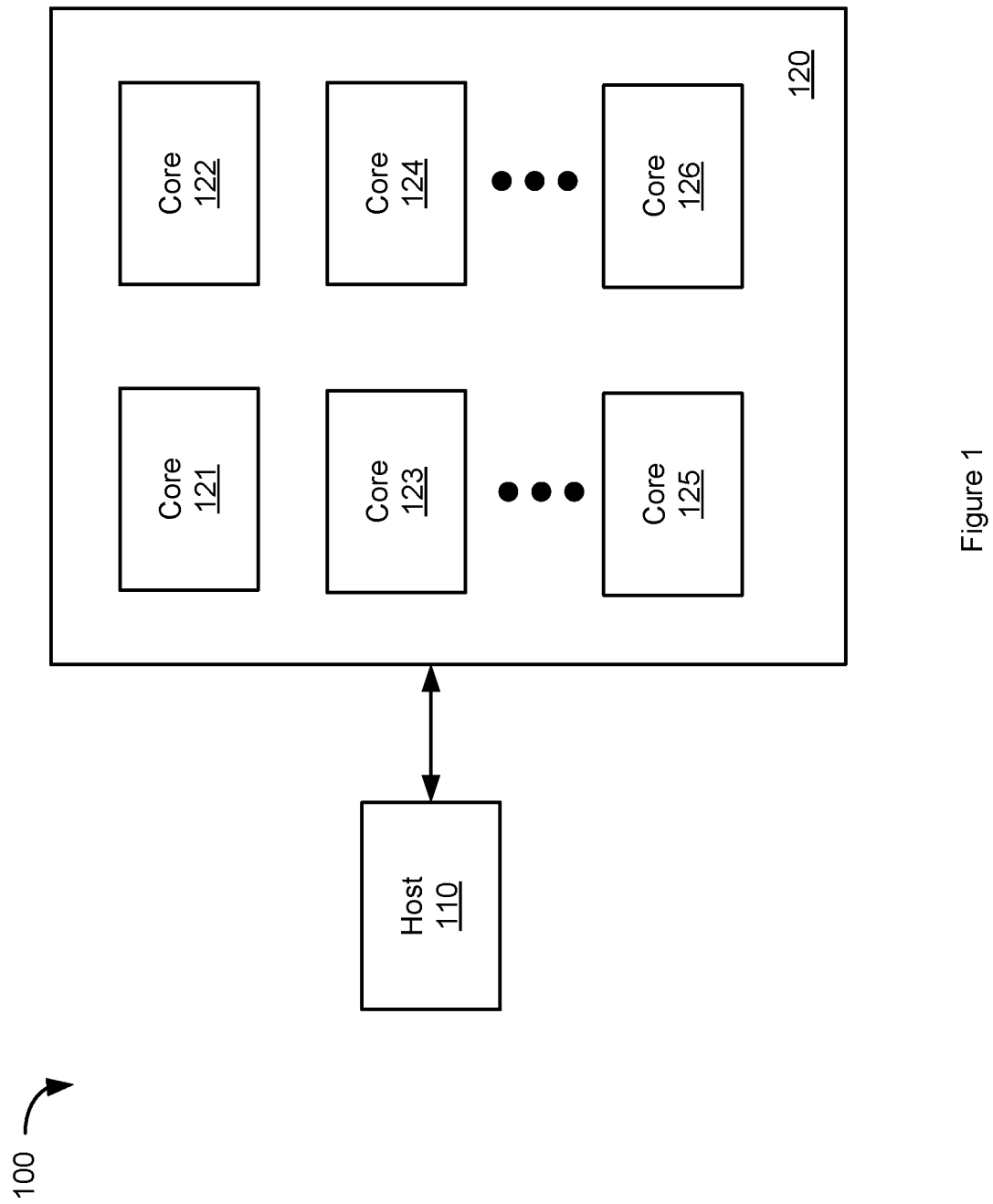
FIG. 1 illustrates a droop event occurrence within an exemplary chip.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein. It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Referring now to FIG. 1, a droop event occurrence within an exemplary chip is illustrated. The system 100 shows a host core 110 in communication with a plurality of cores 120. For example, the plurality of cores 120 may include cores 121-126. However, it is appreciated that any number of cores may be used and the number of cores shown is for illustration purposes only and should not be construed as limiting the embodiments. The host core 110 may be identical to cores 121-126 and is differentiated momentarily in that it runs certain operating system code. The host core 110 may control the cores 120 and an event, e.g., an instruction, may cause a surge of current which may lead to a droop event. In some embodiments, the host core 110 may transmit a Translation Lookaside Buffer Invalidate (TLDI) event to invalidate an entry in all cores 120 which may cause a droop event. In other embodiments, a central processing unit such as the host core 110 may fan out to all cores 120 and halt their activities to process an instruction and subsequently proceeds with restarting the cores 120 activities causing a change in load in a short interval, which may lead to a droop event. In order to detect a droop event, a droop event detection system as described by the examples in FIGS. 2A-2F may be used.

Figure 2A:
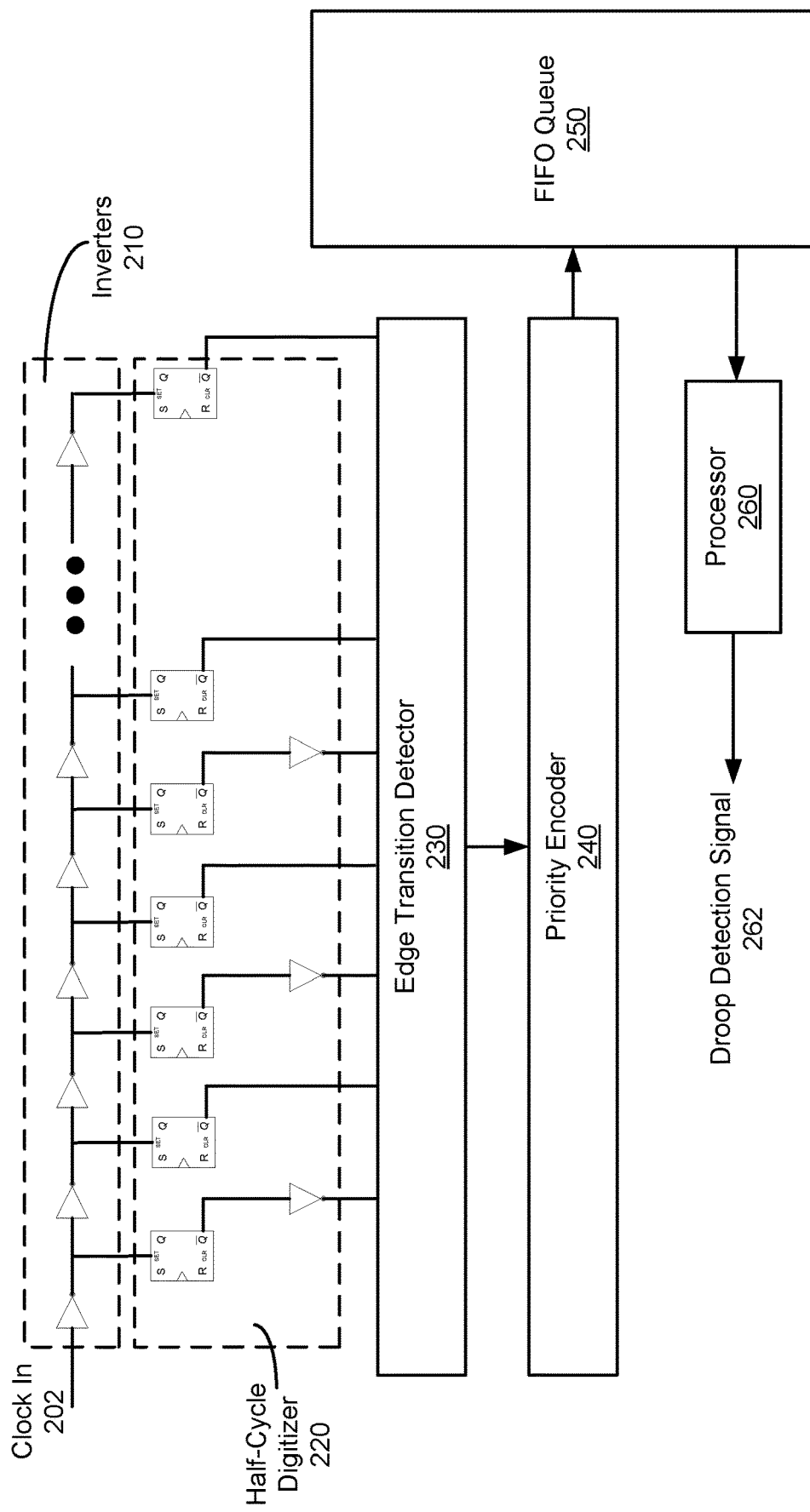
Figure 2B:
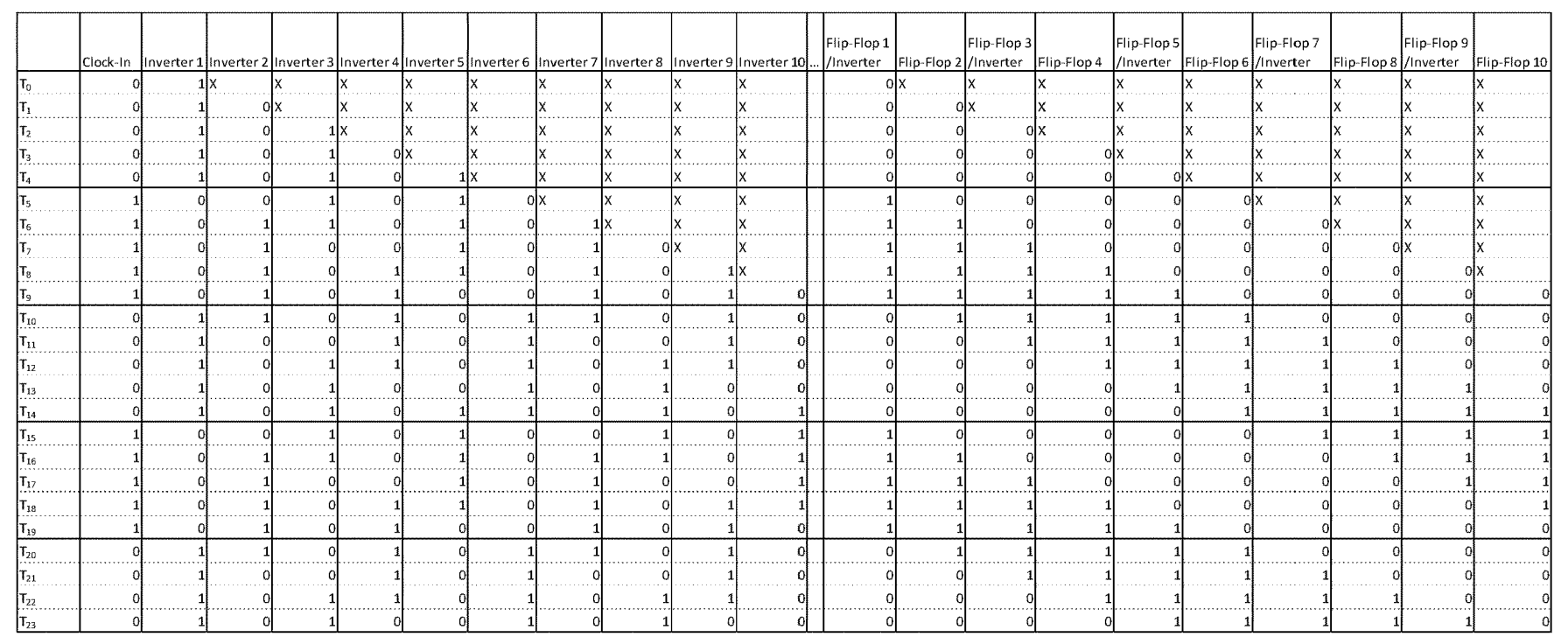

FIGS. 2A-2B show an example of a droop event detection system and an exemplary clocking signal associated therewith in accordance with some embodiments. Referring specifically to FIG. 2A, the droop event detection system may include a plurality of delay elements such as inverters 210, a half-cycle digitizer 220, an edge transition detector 230, a priority encoder 240, a first in first out (FIFO) queue 250, and a processor 260. The droop event detection system determines the number of delay elements, e.g., inverters, that a clocking signal travels through before it transitions, hence half cycle of the clocking signal. The number of inverters is determined and averaged over time. It is determined that a droop event has occurred if the number of inverters that it takes for the half cycle of the clocking signal to travel through changes and exceeds a threshold value.

In some embodiments, the clock in signal 202 is received by the inverters 210. For a non-limiting example, the clock in signal 202 may be a 0 value. The first inverter of the inverters 210 outputs a 1 value, which is an input to the second inverter of the inverters 210, which outputs a value 0, etc. As such, the clock in signal 202 propagates through the inverters 210. The clock in signal 202 values, and the input and output of the inverters 210 are illustrated by the example in FIG. 2B. In the illustrated example, the clock in signal 202 propagates through five inverters of inverters 210 before the clock in signal 202 transitions.

In some embodiments, the output of the inverters 210 is input to the half-cycle digitizer 220, which includes a plurality of flip-flops and inverters. For a non-limiting example, each inverter of the inverters 210 has a corresponding flip-flop in the half-cycle digitizer 220. It is appreciated that every other inverter of the inverters 210 has a corresponding inverter in the half-cycle digitizer 220 in order to address the signal inversion by the inverters 210. The input/output values for the half-cycle digitizer 220 that includes flip-flops and flip-flop/inverter combination are illustrated in FIG. 2B.

In some embodiments, the half-cycle digitizer 220 outputs a signal to the edge transition detector 230, which is configured to detect when the clock in signal 202 transitions. In some embodiments, the edge transition detector 230 detects an edge transition during each half cycle of the clock in signal 202. It is appreciated that in some embodiments, the edge transition detector 230 may include a logical XOR gate. For a non-limiting example, the half-cycle digitizer 220 may output a 0000111110 signal, as shown by the example in FIG. 2B. The logical XOR gate may then output a 000100001 signal. As such, the 1 value indicates the half cycles of the clock in signal 202 and when the transition occurs.

In some embodiments, the output of the edge transition detector 230 is input to the priority encoder 240. It is appreciated that the priority encoder 240 may be a truth table and determine the number of bits before a value 1 is encountered. For a non-limiting example, the priority encoder 240 may determine that 4 bits of 0 values before a bit value 1 is encountered, thereby determining that the clock in signal 202 propagates through 5 inverters before the clock signal 202 transitions, determining the half cycle for the clock signal 202.

In some embodiments, the output of the priority encoder 240 may be an input to FIFO queue 250. For a non-limiting example, the number of inverters that the clock in signal 202 propagates through is determined for 1000 half cycles and it may be stored in the FIFO queue 250. Each new value may be pushed onto the FIFO queue 250 and the oldest value may be removed. The processor 260 accesses the FIFO queue 250 and determines the average number of inverters based on the values stored in the FIFO queue 250. In some embodiments, the processor 260 maintains a running average for the number of inverters associated with half cycle of the clock in signal 202. Denoting the number of inverters in a half cycle at time t as $N_t$ over a period of time T, the average number of inverters may be determined as:

$$N_{avg} = \frac{1}{T}\sum_{t=0}^{T-1} N_t.$$

It is further appreciated that, in some embodiments, the processor 260 may determine that a droop event has occurred if an entry in the FIFO queue 250 exceeds the running average by a threshold amount. It is appreciated that the threshold amount may be a percentage, e.g., 5%, 10%, etc. The processor 260 outputs a droop detection signal 262 indicating whether a droop event has been detected.

Accordingly, the average number of inverters over a period T provides a baseline view of the voltage over the prior T and a droop event is detected when there is a significant deviation from the average. As a result, the circuitry as described detects droop events without configuring a specific voltage, which is not only difficult to achieve in practice due to voltage variations over longer term period due to load variations and Dynamic Voltage Frequency Scaling (DVFS) but is also impractical because the number of inverters at a specific voltage changes with temperature and with part characteristics.

It is appreciated that, while inverters 210 are used for illustration purposes, other delay elements may also be used. Similarly, the use of flip-flops and flip-flop/inverter combination in the half-cycle digitizer 220 is for illustration purposes only and should not be construed as limiting the scope of the embodiments. It is further appreciated that the discussion of the FIFO queue 250 is for illustration purposes and should not be construed as limiting the scope of the embodiments. For example, other memory components may be used instead. Moreover, it is appreciated that while the embodiments are described with the inverters 210 daisy chained together, other configurations may be utilized and the illustration of the embodiments in a daisy chained configuration should not be construed as limiting the embodiments.

Figure 2C:
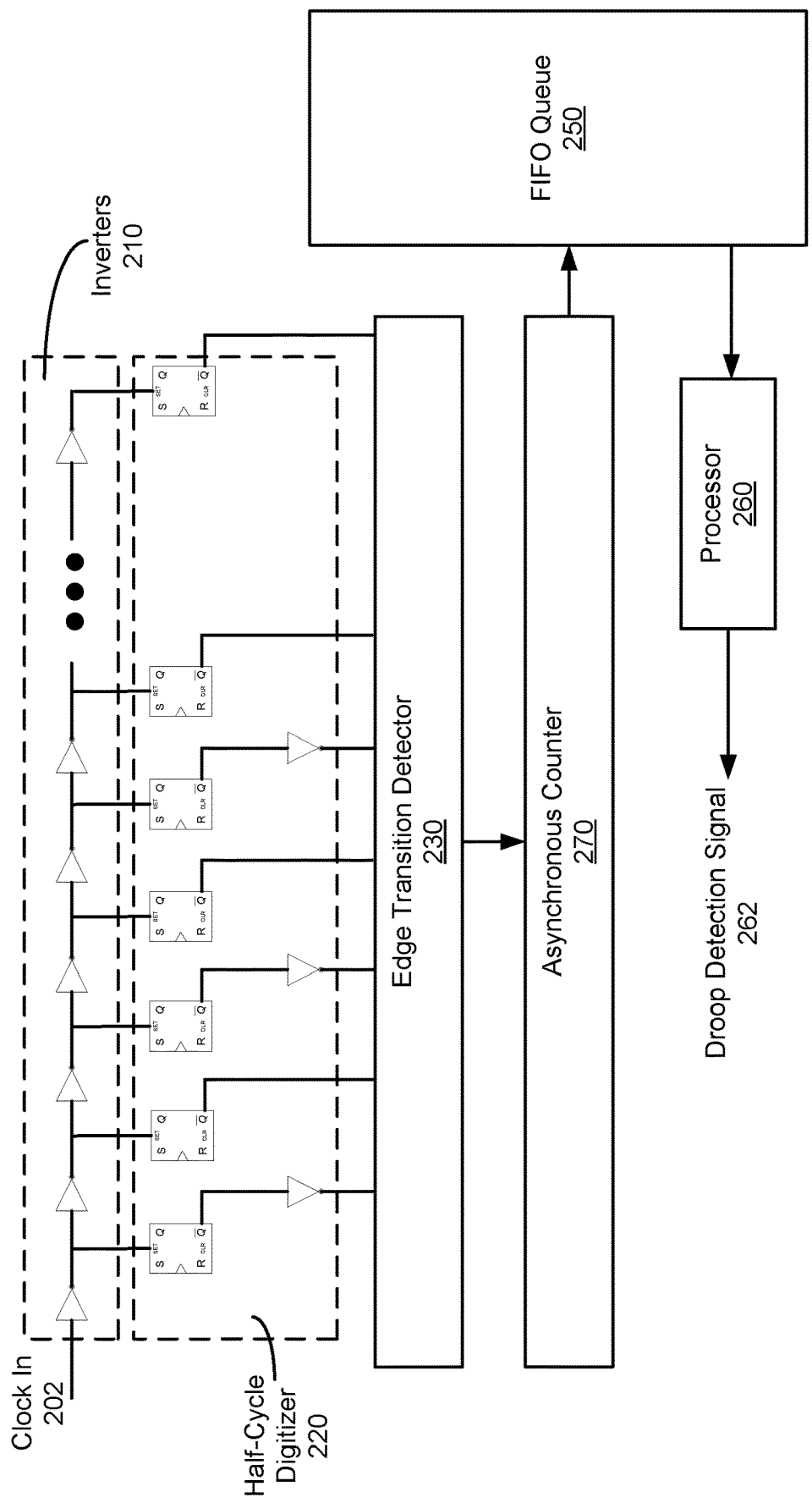
FIGS. 2C-2F show examples of droop event detection systems in accordance with alternative embodiments.

Referring now to FIG. 2C, another example of a droop event detection system in accordance with some embodiments is shown. FIG. 2C is substantially similar to that of FIG. 2A except that the priority encoder 240 is replaced with an asynchronous counter 270. Asynchronous counter 270 is configured to count the number of inverters preceding the clock in signal 202 transitioning.

Figure 2D:
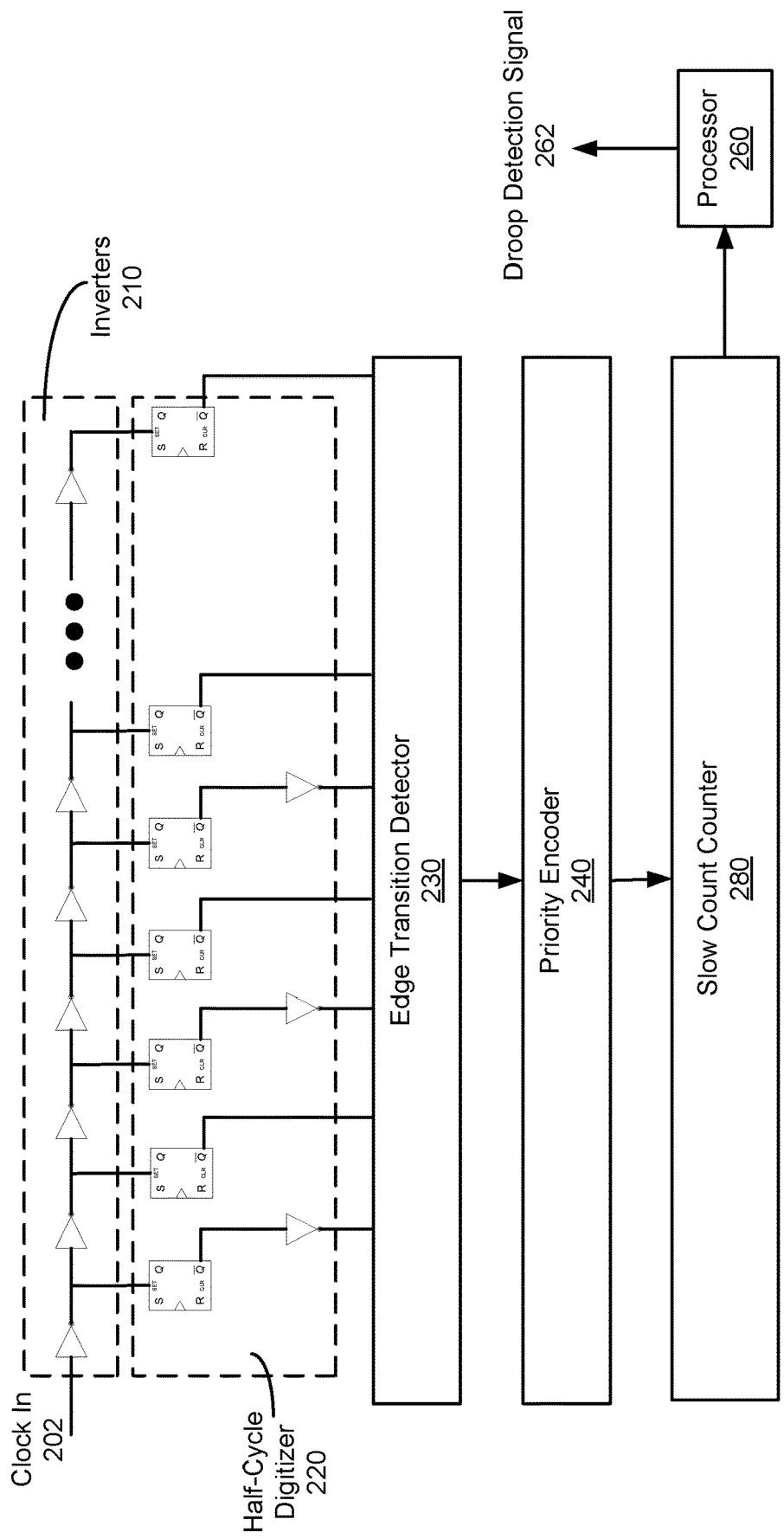

Referring now to FIG. 2D, another example of a droop event detection system in accordance with some embodiments is shown. FIG. 2D is substantially similar to that of FIG. 2A except that instead of using a FIFO queue 250, a slow count counter 280 is used. In some embodiments, the slow count counter 280 increments each time the instantaneous count associated with the inverter is greater than the slow count and it decrements if the instantaneous count associated with the inverter is less than the slow count. For a non-limiting example, when the system starts up, the slow count is zero. As such, the first instantaneous count causes the slow count counter 280 to increment because the number of instantaneous inverters is greater than 0. The process continues, until the instantaneous count is less than the slow count at which point the slow count 280 decrements.

In some embodiments, the processor 260 determines the average by summing the values of the slow count counter 280 and it averages to determine the running average. The process continues over time. The processor 260 determines whether a droop event has occurred by using the determined average, the instantaneous count for the number of inverters, and the threshold value, as discussed above.

Figure 2E:
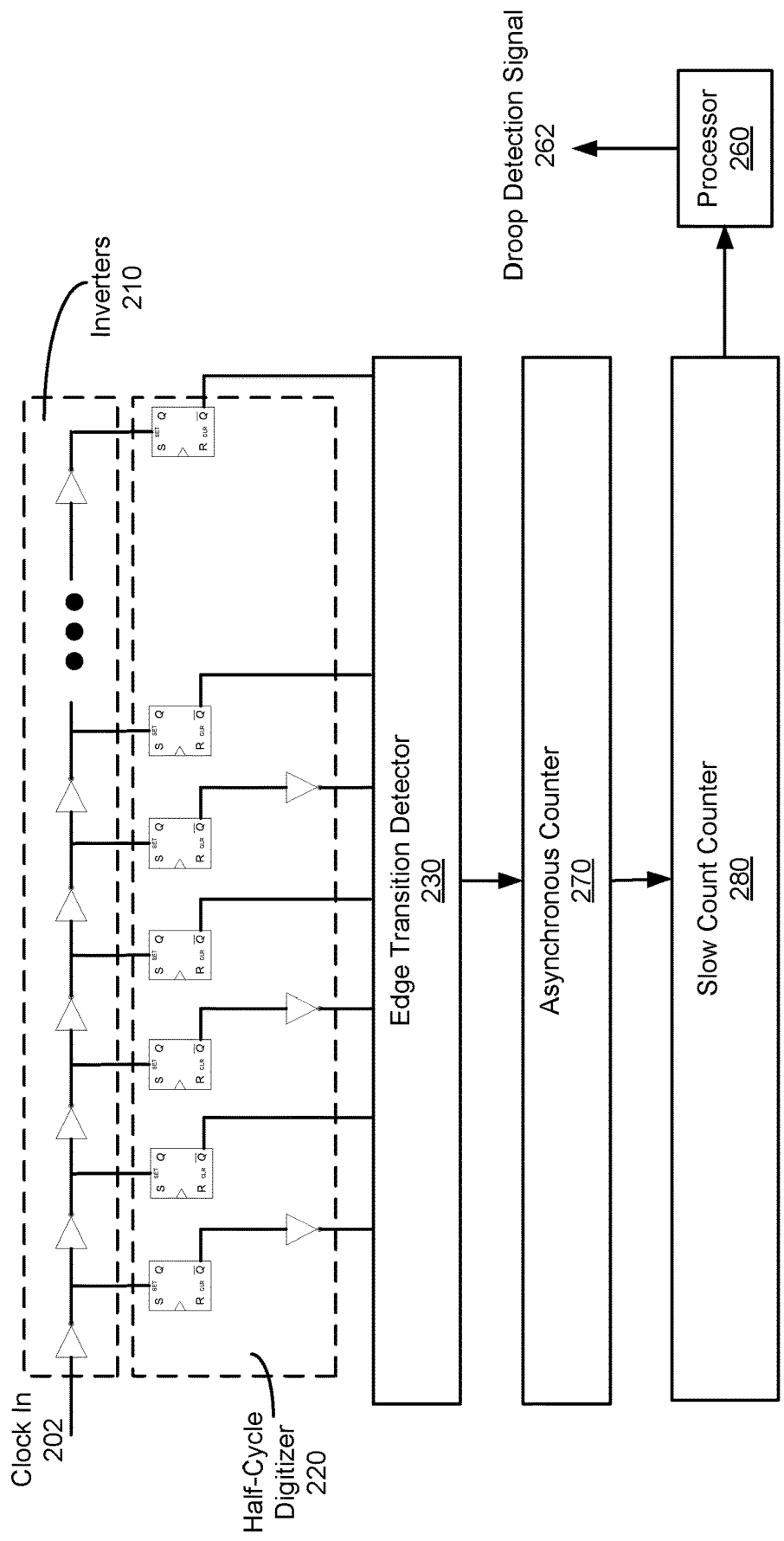

Referring now to FIG. 2E, another example of a droop event detection system in accordance with some embodiments is shown. FIG. 2E is substantially similar to FIG. 2A except that the priority encoder 240 is replaced with the asynchronous counter 270 and that the FIFO queue 250 is replaced with the slow count counter 280.

Figure 2F:
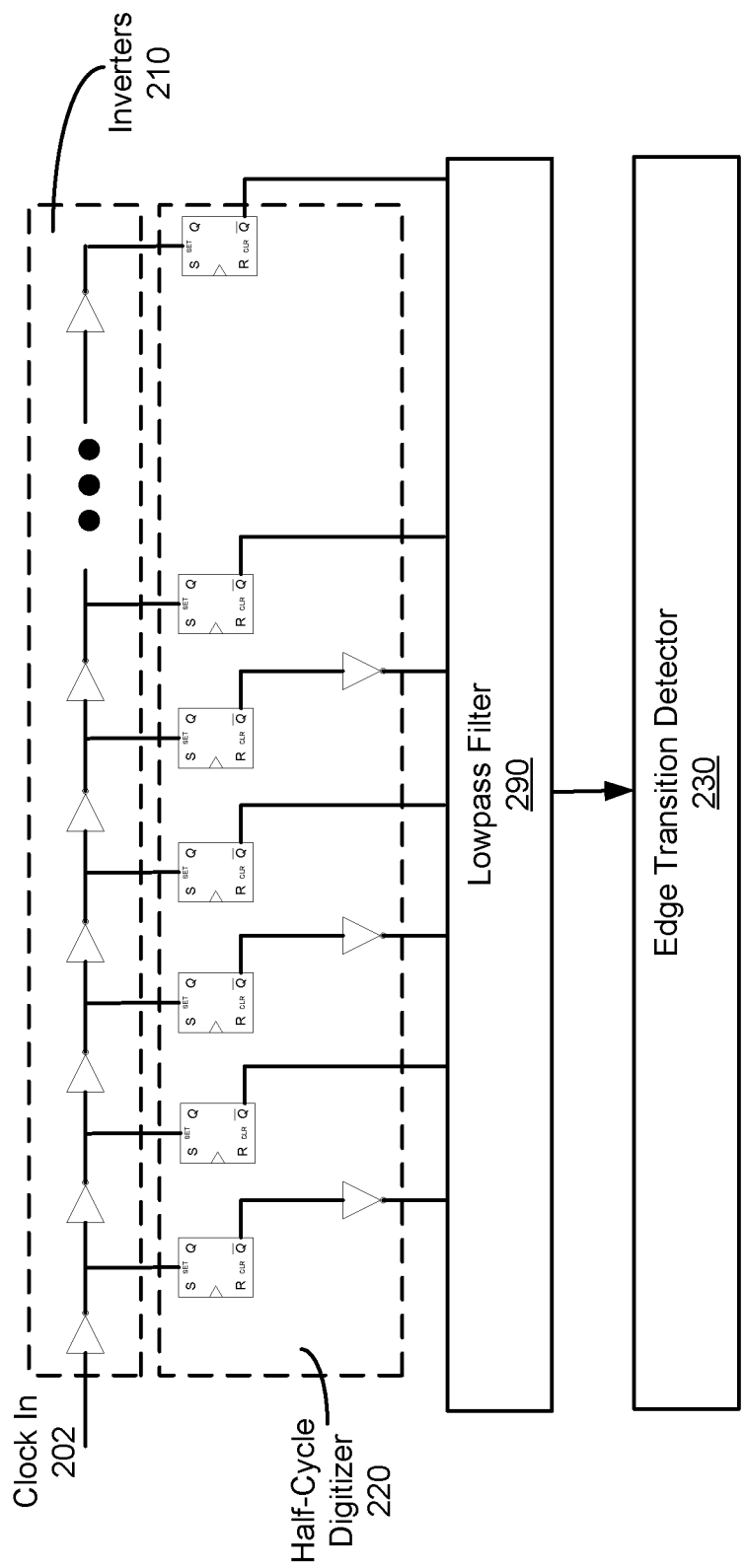

Referring now to FIG. 2F, another example of a droop event detection system in accordance with some embodiments is shown. In this embodiment the output from the half-cycle digitizer 220 is input to a lowpass filter 290 which is then input to the edge transition detector 230. In some embodiments, the lowpass filter 290 may include a logical OR gate, a logical NOR gate, etc. For non-limiting examples, the logical OR gate may be a two input OR gate, a three input OR gate, a four input OR gate, etc. In some embodiments, the lowpass filter 290 is configured to remove possible glitches in the system. In some embodiments, the lowpass filter 290 may be positioned between the half-cycle digitizer 220 and the edge transition detector 230 while the remainder of the droop detection system may be substantially similar to that of FIGS. 2A, and 2C-2E.

For a non-limiting example, a two-input logical OR gate may receive the input signal 0000111110 from the half-cycle digitizer 220. However, due to a glitch in the system one of the bits may be flipped and the received signal may be 00001 0111. The output of the logical OR gate may be 00011111, which has corrected for the inadvertent glitch in the system.

Figure 3A:
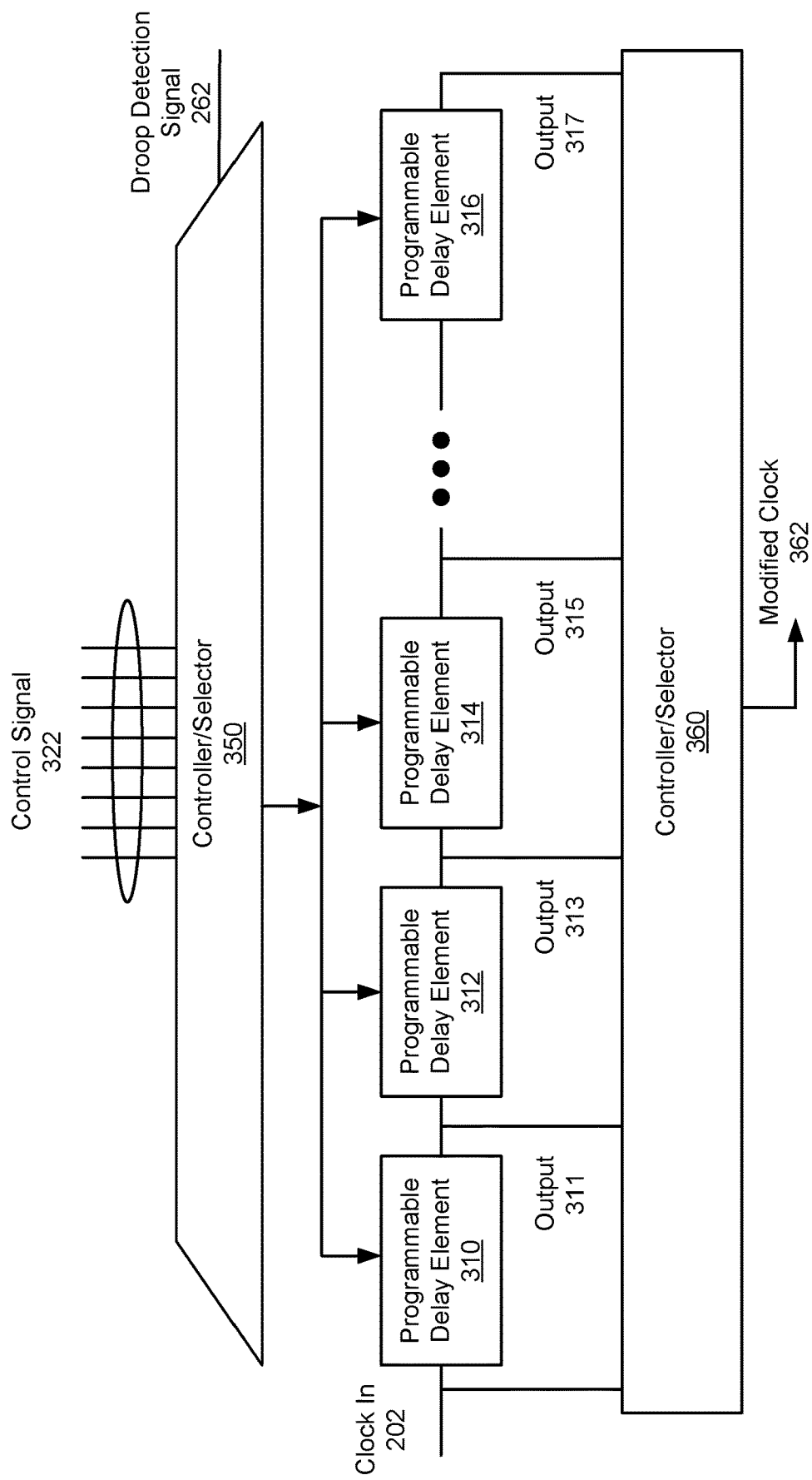
FIGS. 3A-3B show an example of a droop event compensating system and a clocking scheme in accordance with some embodiments.
Figure 3B:
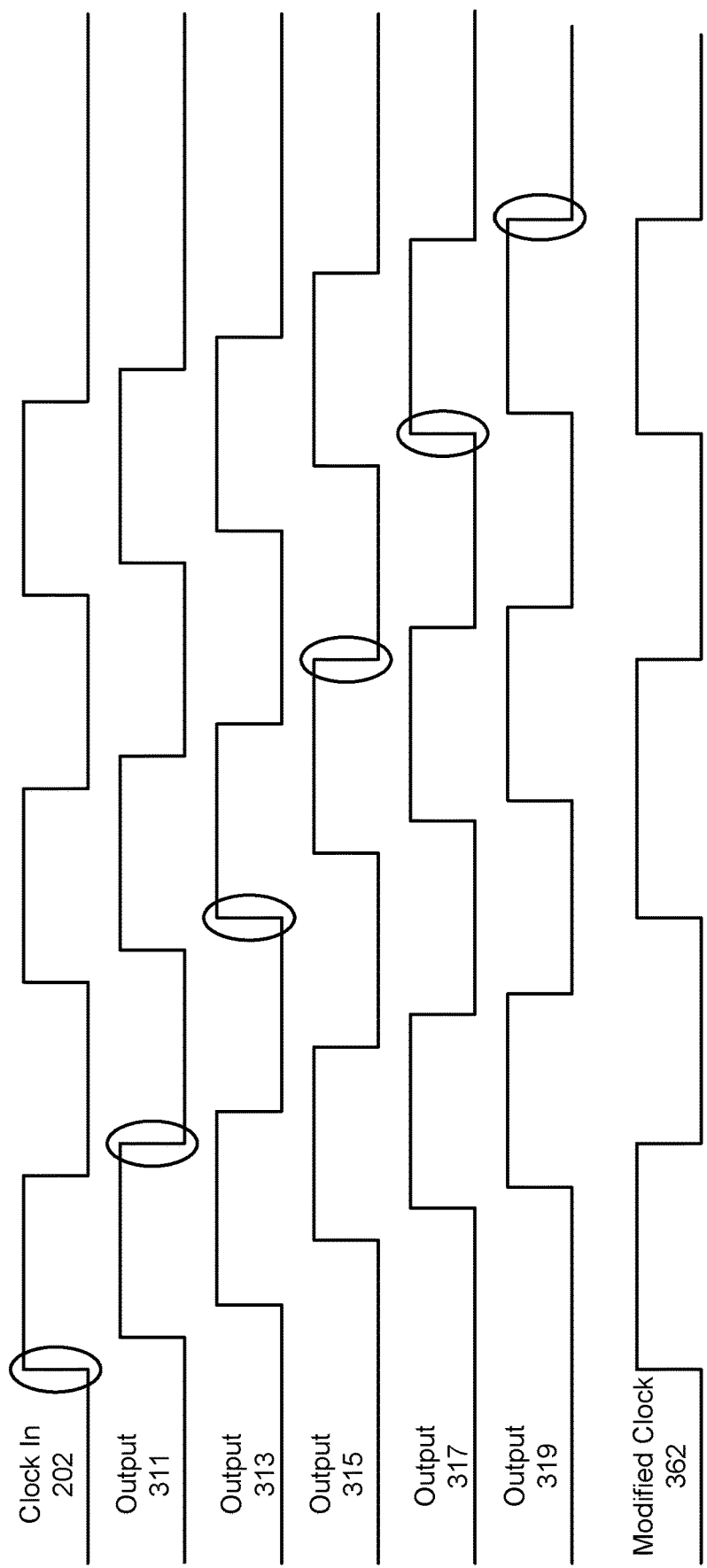

FIGS. 3A-3B show an example of a droop event compensating system and an example of a clocking scheme in accordance with some embodiments. Referring now to FIG. 3A, an example of a droop event compensating system according to some embodiments is shown. The droop event compensating system may include programmable delay elements 310, 312, 314, . . . , 316, a controller/selector 350, and a controller/selector 360. The programmable delay elements 310, 312, 314, . . . , 316 may be a delayed lock loop (DLL). The droop event compensating system may delay the input signal, e.g., clock in signal 202, using the programmable delay elements 310, 312, 314, . . . , 316. The droop event compensating system may then select rising edge and falling edge from different programmable delay elements in order to form a modified clocking signal 362, thereby changing the clock frequency to compensate for the droop event.

In some embodiments, the controller/selector 350 may be a multiplexer and it may receive the droop detection signal 262 from droop detection system, as described in FIGS. 2A-2F. In some embodiments, the droop detection signal 262 may indicate whether a droop event has occurred. The controller/selector 350 may further receive control signals 322. The control signal 322 enables the controller/selector 350 to program the programmable delay elements 310, 312, 314, . . . , 316 when a droop detection event has occurred. For a non-limiting example, in some embodiments, the control signal 322 enables the controller/selector 350 to program respective programmable delay elements such that the input signal is delayed by a particular delay amount. In some embodiments, the delay amount for each programmable delay element may be different or it may be the same. In some embodiments, the delay amount between two programmable delay elements may be different.

It is appreciated that in some embodiments, the programmable delay element 310 receives the clock in signal 202. The controller/selector 350 programs the programmable delay element 310 to delay the clock in signal 202 by a delay amount, as shown in FIG. 3B. In some embodiments, the delayed clock output 311 from the programmable delay element 310 is an input into the programmable delay element 312. The programmable delay element 312 is similarly programmed, e.g., by the controller/selector 350, to delay the received signal 311 by a certain delay amount, which may or may not be the same as the delay amount in the programmable delay element 310, as shown in FIG. 3B. The delayed clock output 313 from the programmable delay element 312 is input into the programmable delay element 314. The programmable delay element 314 is similarly programmed, e.g., by the controller/selector 350, to delay the received signal 313 by a certain delay amount, which may or may not be the same as the delay amount in the programmable delay elements 310 and 312, as shown in FIG. 3B. The delayed clock output 315 from the programmable delay element 315 is input into subsequent programmable delay elements. Finally, the programmable delay element 316 receives the delayed clock signals from preceding programmable delay elements and delays the signal by a certain delay amount in a similar fashion to previous programmable delay elements. The delayed clock signal 317 is output.

In some embodiments, the controller/selector 360 is configured to receive the clock in signal 202 as well as the delayed clock signals 311, 313, 315, . . . , and 317. The controller/selector 360, e.g., a multiplexer, is configured to selectively pick and choose rising/falling edges from the received signals in order to form a modified clocking signal 362. For a non-limiting example, the controller/selector 360 may select one or more of the first rising edge from the clock in signal 202, the first encountered falling edge of the output signal 311, the first encountered rising edge of the output signal 313, the first encountered falling edge of the output signal 315, the first encountered rising edge of the output signal 317, and the first encountered falling edge of the output signal 319 to form the modified clock 362. Accordingly, the clock frequency is modified to compensate for the droop event.

It is appreciated that the configuring the programmable delay elements in a daisy chained structure is for illustration purposes only and should not be construed as limiting the scope of the embodiments. Moreover, the number of programmable delays is for illustration purposes and even non-programmable delay elements may be used. It is appreciated the embodiments of FIGS. 3A-3B were described as selecting the first encountered falling/rising edges for illustration purposes only and should not be construed as limiting the embodiments. For a non-limiting example, in some embodiments, the first rising edge of the clock in signal 202 may be selected while the second encountered rising/falling edge can be selected as the falling edge, etc. In other non-limiting examples, some of the output signals may be skipped in the selection. For example, the first rising edge of the clock in signal 202 may be selected, the output signal 311 may be skipped, and the first encountered falling edge of the output signal 313 may be selected. As such, the selection of the rising/falling edges may be from any of the signals 202, 311, 313, 315, . . . , and 317 and some may not be selected at all. The selection of the first encountered falling/rising edges, as described in FIG. 3B, is for illustration purposes only and should not be construed as limiting the embodiments.

Figure 4:
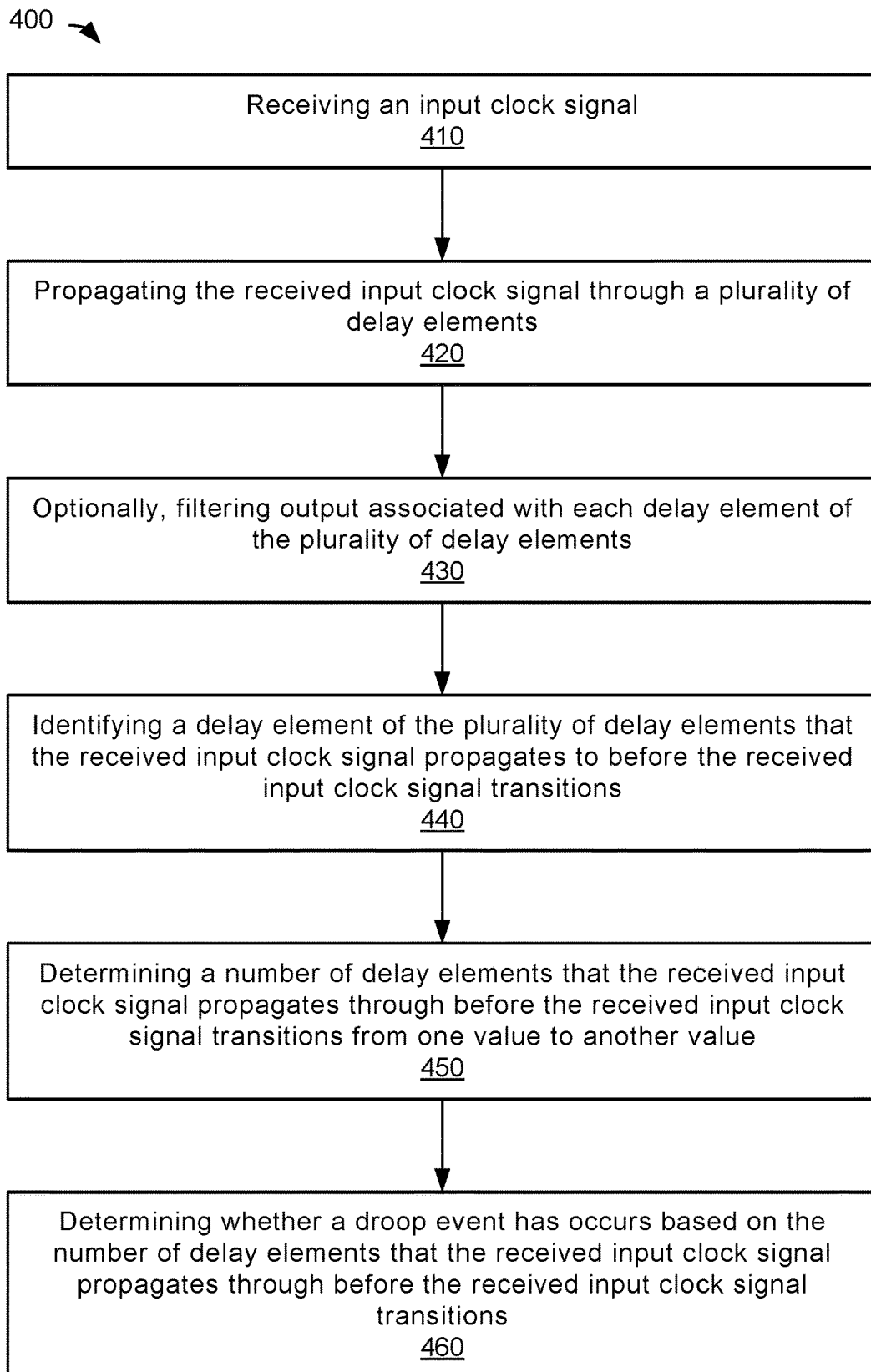
FIG. 4 shows an example of a method flow for detecting a droop event in accordance with some embodiments.

FIG. 4 shows an example of a method flow 400 for detecting a droop event in accordance with some embodiments. At step 410, an input clock signal may be received, as discussed in FIGS. 2A-2F. At step 420, the received clock signal may be propagated through a plurality of delay elements, e.g., inverters, as described in FIGS. 2A-2F. It is appreciated that the output of delay elements may be input into a half-cycle digitizer, as described in FIGS. 2A-2F. At step 430, the output associated with the delay elements may be filtered in order to remove or minimize glitches, as described in FIG. 2F. At step 440, a delay element of the plurality of delay elements that the received input clock signal propagate to before the received input clock signal transitions, e.g., from a 0 to a 1 or vice versa, is determined, as described in FIGS. 2A-2F. At step 460, it is determined whether a droop event has occurred based on the number of delay elements that the received input clock signal propagates through before the received input clock signal transitions, as discussed with respect to FIGS. 2A-2F.

Figure 5:
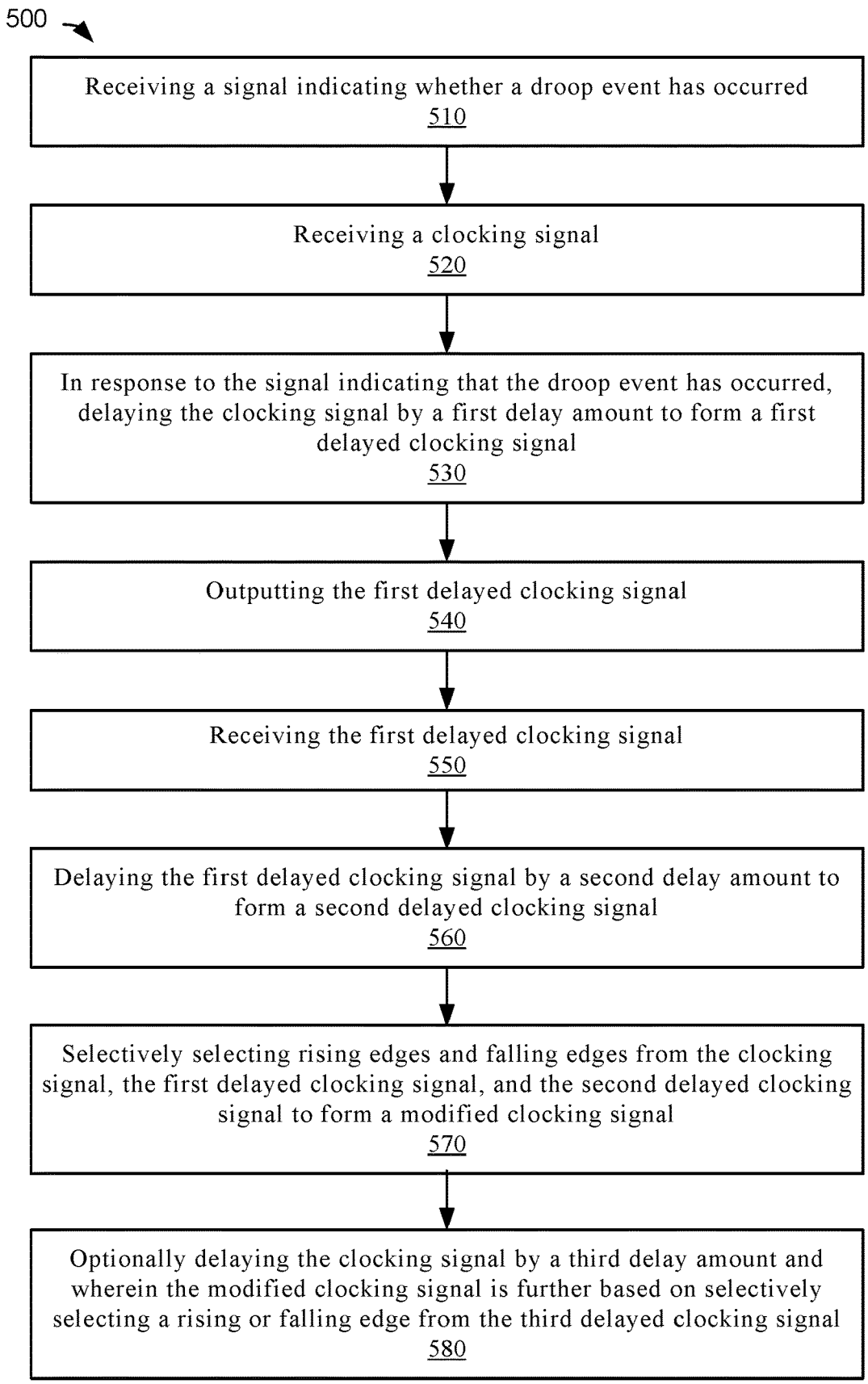
FIG. 5 shows an example of a method flow for compensating for a droop event in accordance with some embodiments.

FIG. 5 shows an example of a method flow 500 for compensating for a droop event in accordance with some embodiments. At step 510, a signal indicating whether a droop detection has occurred is received, as described in FIGS. 2A-3B. Moreover, at step 520, a clocking signal is received. In response to the signal indicating that the droop event has occurred, at step 530, the received clock signal is delayed by a first delay amount to form a first delayed clock signal, as described in FIGS. 3A-3B. At step 540, the first delayed clocking signal is output, as discussed in FIGS. 3A-3B. The first delayed clock signal is received at step 550, for example by another programmable delay element, as described in FIGS. 3A-3B. The received first delayed clock signal may further be delayed by a second delay amount to form a second delayed clocking signal, at step 560, as described in FIGS. 3A-3B. It is appreciated that the first delay amount may be different from the second delay amount and they may be programmable.

At step 570, the rising/falling edges from the clocking signal, the first delayed clocking signal, and the second delayed clocking signal may be selected to form a modified clocking signal, as described in FIGS. 3A-3B. It is appreciated that optionally at step 580, the clocking signal may be further delayed by a third delay amount and the formation of the modified clocking signal may further be based on the third delayed clocking signal.

Accordingly, the embodiments described detect a sudden rise in chip activity that may lead to a droop event (e.g., voltage droop). Furthermore, the embodiments compensate for the sudden rise in activity by forming a modified clocking signal to compensate for the droop event. For example, in some embodiments, the modified clocking signal reduces the frequency of the clocking signal when a droop event is detected to maintain the chip operational and functional. It is appreciated that the embodiments modify the clocking signal intelligently without a significant drop in performance, which may be experienced if the frequency of the clocking signal is halved. Furthermore, the embodiments compensate for the droop event without using a phase locked loop (PLL) because PLL's response time is typically in the microseconds range and therefore not fast enough when a droop event occurs. The embodiments quickly reduce the frequency by a flexible amount depending on the circumstances, therefore compensating for the droop events.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and the various modifications that are suited to the particular use contemplated.

What is claimed is:

1. A system comprising:
    a first plurality of inverters configured to receive an input clock signal, wherein the inverters of the first plurality of inverters are coupled in series to one another, and wherein each inverter is configured to receive an input signal and output an inverted and delayed version of the input signal;
    a plurality of flipflops, wherein each flipflop of the first plurality of flipflops is coupled to respective output of inverter of the first plurality of inverters;
    a second plurality of inverters, wherein the second plurality of inverters is coupled to output of every other flipflop of the plurality of flipflops;
    an edge transition detector coupled to the plurality of flip-flops, wherein the edge transition detector is configured to detect the input clock signal transitioning from one value to another value through the first plurality of inverters;
    a circuitry configured to determine a number of inverters of the first plurality of inverters wherein the input clock signal propagates through the number of inverters prior to the input clock signal transitioning; and
    a processor configured to determine whether a droop event has occurred based on the number of inverters.

2. The system as described in claim 1, wherein the edge transition detector is an exclusive or logic gate.

3. The system as described in claim 1, wherein the circuitry is a priority encoder.

4. The system as described in claim 1, wherein the circuitry is a truth table.

5. The system as described in claim 1 further comprising a low pass filter coupled to output of the plurality of flipflops and the second plurality of inverters and further coupled to input of the circuitry.

6. The system as described in claim 5, wherein the low pass filter is a logic OR gate.

7. The system as described in claim 1 further comprising a first-in-first-out (FIFO) queue configured to store the number of inverters and further configured to store prior number of inverters that the input clock signal propagates through prior to the input clock signal transitioning, and wherein the processor is further configured to determine an average of the number of inverters based on the number of inverters and further based on the prior number of inverters, wherein the processor is further configured to determine whether the number of inverters exceeds the average by a threshold and in response thereto configured to determine whether the droop event has occurred.

8. The system as described in claim 1 further comprising a first-in-first-out (FIFO) queue configured to store a current count number and prior count numbers wherein the current count number is incremented version of its immediate prior counts if the number of inverters is greater than an average of prior count numbers and wherein the current count number is decremented version of its immediate prior counts if the number of inverters is less than the average of prior count numbers, and wherein the processor is further configured to determine an average of the prior count numbers and update the average with the current count number, and wherein the processor is further configured to determine whether the number of inverters exceeds the average by a threshold and in response thereto configured to determine whether the droop event has occurred.

9. A system comprising:
a plurality of delay elements configured to receive an input clock signal;
an edge transition detector coupled to the plurality of delay elements, wherein the edge transition detector is configured to detect the input clock signal transitioning from one value to another value through the plurality of delay elements;
a circuitry configured to determine a number of delay elements of the plurality of delay elements that the input clock signal propagates through prior to the input clock signal transitioning; and
a processor configured to determine whether a droop event has occurred based on the number of delay elements.

10. The system as described in claim 9, wherein the edge transition detector is an exclusive or logic gate.

11. The system as described in claim 9, wherein the circuitry is a priority encoder.

12. The system as described in claim 9, wherein the circuitry is a truth table.

13. The system as described in claim 9 further comprising a low pass filter coupled to output of the plurality of delay elements and further coupled to input of the circuitry.

14. The system as described in claim 13, wherein the low pass filter is a logic or gate.

15. The system as described in claim 9 further comprising a first-in-first-out (FIFO) queue configured to store the number of delay elements and further configured to store prior number of delay elements that the input clock signal propagates through prior to the input clock signal transitioning, and wherein the processor is further configured to determine an average of the number of delay elements based on the number of delay elements and further based on the prior number of delay elements, wherein the processor is further configured to determine whether the number of delay elements exceeds the average by a threshold and in response thereto configured to determine whether the droop event has occurred.

16. The system as described in claim 9 further comprising a first-in-first-out (FIFO) queue configured to store a current count number and prior count numbers wherein the current count number is incremented version of its immediate prior counts if the number of delay elements is greater than an average of prior count numbers and wherein the current count number is decremented version of its immediate prior counts if the number of delay elements is less than the average of prior count numbers, and wherein the processor is further configured to determine an average of the prior count numbers and update the average with the current count number, and wherein the processor is further configured to determine whether the number of delay elements exceeds the average by a threshold and in response thereto configured to determine whether the droop event has occurred.

17. The system as described in claim 9 further comprising a plurality of flip-flops wherein each flip-flop of the plurality of flip-flops is coupled to respective output of delay element of the plurality of delay elements.

18. A method comprising:
receiving an input clock signal;
propagating the received input clock signal through a plurality of delay elements;
determining a number of delay elements that the received input clock signal propagates through before the received input clock signal transitions from one value to another value; and
determining whether a droop event has occurs based on the number of delay elements that the received input clock signal propagates through before the received input clock signal transitions.

19. The method as described in claim 18 further comprising identifying a delay element of the plurality of delay elements that the received input clock signal propagates to before the received input clock signal transitions.

20. The method as described in claim 18 further comprising filtering output associated with each delay element of the plurality of delay elements, wherein the filtering corrects glitches associated with outputs of delay elements of the plurality of delay elements.

* * * * *